(12) United States Patent
Beales et al.

(10) Patent No.: US 6,933,985 B2
(45) Date of Patent: Aug. 23, 2005

(54) APPARATUS AND METHOD FOR COMPENSATION OF TEMPERATURE DRIFT OF SAW FILTERS

(75) Inventors: Stephen Beales, Saltaire (GB); Darren Butler, Shipley (GB)

(73) Assignee: Pace Micro Technology Plc, Shipley (GB)

( * ) Notice: Subject to any disclaimer, the term of this patent is extended or adjusted under 35 U.S.C. 154(b) by 554 days.

(21) Appl. No.: 10/217,978

(22) Filed: Aug. 13, 2002

(65) Prior Publication Data

US 2003/0035071 A1 Feb. 20, 2003

(30) Foreign Application Priority Data

Aug. 14, 2001 (GB) .............................................. 0119714

(51) Int. Cl.[7] .............................. H04N 5/50; H04N 5/44
(52) U.S. Cl. ....................................... 348/731; 348/725
(58) Field of Search ................................ 348/731, 725, 348/726, 732, 733; 310/313 R, 315; 455/3.02; 331/176; 725/68, 70; H04N 5/44, 5/50

(56) References Cited

U.S. PATENT DOCUMENTS 4,271,433 A * 6/1981 Theriault .................... 348/731
5,654,774 A * 8/1997 Pugel et al. ................... 725/70
5,898,900 A * 4/1999 Richter et al. .............. 348/731

* cited by examiner

Primary Examiner—Sherrie Hsia
(74) Attorney, Agent, or Firm—Head, Johnson & Kachigian

(57) ABSTRACT

The invention relates to a method of controlling the operation of a voltage controlled oscillator (VCO) with respect to a SAW filter (6) within a broadcast data receiver (BDR) (104). Over time, it is found that during normal operation of the BDR (104), the SAW filter (6) is susceptible to frequency drift which can affect the operation of the BDR. In accordance with the invention, temperature readings are taken at various time intervals from within the BDR (104) to provide an indication of changes in temperature over time and, if the temperature does change in the BDR with time then the operating frequency of the VCO can be adjusted to a predefined frequency value which is appropriate for the temperature values measured. By adjusting the operating frequency of the VCO with changes in temperature, the drift of the SAW filter (6) can be compensated for, thereby ensuring the continued operation of the BDR (104) in the required manner.

11 Claims, 3 Drawing Sheets

Graph and Table of SAW temperature compensation

Example of look up table

| Measured temperature deg C | Demodulator VCO frequency MHz |
|---|---|
| <0 | 45.60 |
| 5 | 45.60 |
| 10 | 45.65 |
| 15 | 45.65 |
| 20 | 45.70 |
| 25 | 45.70 |
| 30 | 45.75 |
| 35 | 45.75 |
| 40 | 45.80 |
| 45 | 45.80 |
| 50 | 45.85 |
| 55 | 45.85 |
| >60 | 45.90 |

```
  Function: _analog_TemperatureCompensate                
                                                          
  Purpose : Compensate for variations in temperature      
                                                          
  Assumes : None.                                         
                                                          
  Inputs  : None.                                         
  Outputs : None.                                         
  Returns : None.                                         
                                                          
************************************************************/
static void _analog_TemperatureCompensate(bool UseISR)
{
  uint32_t N2=0;
  int32_t  h;
  uint32_t Frequency;
  bool     chanisdigital;
  ANALOG_PRINTF1("ANALOG: COMPENSATING FOR TEMPERATURE\n");
  /* For safety ask the tuner if we are a digital channel or not */
  core_TunerGetFrequency(&chanisdigital, &Frequency);
  ANALOG_PRINTF3("FREQ FROM TUNER=%d FREQ FROM FINE TUNE=%d\n",Frequency,
  AnalogState.Coeffs.ActualFrequency);
  /* Use the frequency */
  Frequency = AnalogState.Coeffs.ActualFrequency;
  if (chanisdigital==false)
  {
     /* Measure temperature in degree c */
     AnalogState.Temperature = _analog_GetTemperature();
     /* Put some limits on the measured temperature */
     if(AnalogState.Temperature < MIN_CALCULATED_TEMP)
     {
          AnalogState.Temperature = MIN_CALCULATED_TEMP;
     }
     if(AnalogState.Temperature > MAX_CALCULATED_TEMP)
     {
          AnalogState.Temperature = MAX_CALCULATED_TEMP;
     }
     ANALOG_PRINTF2("ANALOG: TEMPERATURE    = %d\n",AnalogState.Temperature);
     ANALOG_PRINTF2("ANALOG: IN FREQUENCY   = %d\n",Frequency);
     /* N2 is the value written to the tuner's 2nd PLL which was used to control the tuner during a fine tune */
     N2 = AnalogState.Coeffs.N2;
     ANALOG_PRINTF2("ANALOG: ORIGINAL  N2 = %d\n", N2);
     /* SHARP_SECOND_PLL_STEPSIZE_HZ = 62500 */
           /* REFERENCE_TEMPERATURE    = 45  */
     /* HZPERDEGREE            = 3000 */
     h = (SHARP_SECOND_PLL_STEPSIZE_HZ * N2) - (REFERENCE_TEMPERATURE * HZPERDEGREE);
     /* HZPERDEGREE = 3000 */
     N2 = (HZPERDEGREE * AnalogState.Temperature) + h + AnalogState.Coeffs.Offset;
     /* SHARP_SECOND_PLL_STEPSIZE_HZ = 62500 */
     N2 /= SHARP_SECOND_PLL_STEPSIZE_HZ;
     /* AnalogEEROM.Params.N2Delta is a constant and is set to 0 */
     N2 -= AnalogEEROM.Params.N2Delta;
     ANALOG_PRINTF2("ANALOG: COMPENSATED N2 = %d\n", N2);
     /* If there is a change in N2 value, flag that we need to write to the tuner. */
     /* This is done during vertical blanking */
     if(N2 != AnalogState.Coeffs.OldN2)
     {
       ANALOG_PRINTF2("ANALOG. N2 Changed to %d\n",N2);
       AnalogState.DoI2CWrite = true;
           AnalogState.Coeffs.CompensatedN2 = N2;
     }
           AnalogState.Coeffs.OldN2 = N2;
```

FIG. 4

APPARATUS AND METHOD FOR COMPENSATION OF TEMPERATURE DRIFT OF SAW FILTERS

CROSS-REFERENCE TO RELATED APPLICATION

This is an United States Application entitled "Apparatus and Method for Compensation of Temperature Drift of SAW Filters" claiming priority to British Application No. 0119714.4 filed 14 Aug. 2001.

BACKGROUND OF THE INVENTION

This invention relates to an apparatus and a method for the compensation of temperature drift in Surface Acoustic Wave (SAW) filters, and particularly but not exclusively for Intermediate Frequency (I.F) SAW filters of the sort used in television systems.

The following description relates to television systems typically including a display screen and a broadcast data receiver (BDR) connected to or integrally formed therewith. The BDR receives digital data from a broadcaster at a remote location via cable, satellite and/or terrestrial broadcast systems and processes and decodes the data to provide video, audio and/or auxiliary data relating to a number of channels and/or television programs, to the user via the display screen and speakers.

In the abovementioned television systems, SAW filters are used to filter out unwanted signals that could interfere with the processing of the wanted/required signals. In digital applications, unwanted adjacent signals, such as adjacent channel signals, can sometimes be substantially greater than the required digital signals as is the case with analogue signals. To prevent adjacent unwanted signals creating interference with the required signals, the SAW filters are designed to have sharp frequency cut off characteristics. However, a problem with SAW filters is that the centre frequency of the filter drifts with changes in temperature.

Analogue television demodulators which follow the frequency of the SAW filters have to compensate for this frequency drift by also changing their center frequency. If the demodulators did not do this, it would typically result in I.F. flatness being degraded and may result in color loss of the video display. Conventionally, free running voltage-controlled oscillators (VCOs) are used to follow the frequency of the SAW filters, the VCOs having the same temperature drift performance as the SAW filters. However, the demodulators have to be manually tuned to the nominal center frequency in production and this is likely to be both time consuming and expensive. In addition, due to mechanical stress, temperature extremes and/or ageing, these demodulators have a tendency to off tune with time, rendering their performance outside the desired specification and, in some cases, the operation characteristics may be illegal.

More recently, fixed frequency demodulators have been developed using Phase Lock Loop (PLL) techniques which prevent the demodulator VCO from off tuning. However, these demodulators are unable to compensate for the SAW Filter Center Frequency Drift with temperature, thereby resulting in failure of IF flatness. This is a problem facing manufacturers of components for television systems, and particularly so for manufacturers who are required to meet US Cable Federal Communications Commission (FCC) compliance, where IF flatness is a legal requirement of analogue television demodulation.

SUMMARY OF THE INVENTION

It is therefore an aim of the present invention to provide apparatus for and a method by which temperature drift in SAW IF filters can be compensated for in television systems.

According to a first aspect of the present invention there is provided a method by which temperature drift in SAW Filters can be compensated for in a television system, said television system including a broadcast data receiver (BDR) for receiving digital data from a broadcaster at a remote location, said BDR having processing means for processing and decoding said data to provide audio, video and/or auxiliary data relating to a number of channels and/or programs, said BDR processing means including at least one SAW filter and a voltage controlled oscillator (VCO), and characterized in that said method includes the steps of taking one or more temperature reading(s) for the SAW filter, comparing said temperature reading(s) with pre-defined VCO frequency values at pre-defined temperatures, and adjusting, if required, the frequency of the VCO to an appropriate pre-defined frequency value for the temperature reading(s).

Thus, in order to compensate for frequency drift of the SAW filters with temperature, the demodulator VCO is automatically retuned to a frequency appropriate for the recorded/measured temperature.

Preferably the VCOs are PLL exact frequency demodulators.

Preferably temperature sensing means are provided in the BDR to allow said temperature readings to be taken. The temperature sensing means are typically in the locality of the SAW filter.

It will be appreciated by persons skilled in the art that the temperature readings can be forwarded to processing means which then signals the VCO to retune to an appropriate frequency. Alternatively, the temperature readings can be stored in memory of the BDR until a pre-determined point in time in which it is to be used to retune the VCO or to provide a history of the temperature changes in the BDR over a pre-determined time period.

In one embodiment the temperature sensing means includes one or more sensors incorporated in the demodulator integrated circuit (I.C.).

Preferably the SAW filter is an IF SAW filter.

Preferably the pre-defined VCO frequencies are obtained using a software algorithm and/or a look up table. In the embodiment in which a look up table is used, the data from the table is stored in memory in the BDR and accessed using the microprocessor of the BDR.

In one embodiment the one or more temperature readings are average temperature readings taken over a pre-determined period of time.

In an alternative embodiment, the temperature reading is the most recent reading taken from the temperature sensing means. The temperature sensors can take temperature readings at pre-determined times or can continuously measure the temperature and initiate a signal or signals to retune the VCO when a change in temperature is encountered.

According to the a second aspect of the present invention there is provided a television system, said television system including a broadcast data receiver (BDR) for receiving digital data from a broadcaster at a remote location, said BDR having processing means for processing and decoding said data to provide audio, video and/or auxiliary data relating to a number of channels and/or programs, said BDR processing means including at least one SAW filter and a voltage controlled oscillator (VCO), characterized in that temperature sensing means are provided in the BDR to allow one or more temperature readings to be measured and said measured temperature readings are compared against predefined VCO frequencies at different temperatures, thereby allowing the frequency of the VCO to be adjusted to a pre-defined frequency appropriate for the measured temperature.

Preferably the temperature sensing means are provided in the locality of the SAW filter.

Preferably the BDR processing means are provided with a software algorithm and/or look up tables via which the VCO pre-defined frequencies can be obtained.

Preferably the VCO is an exact frequency PLL VCO analogue demodulator Integrated Circuit (IC).

The present invention has the advantage that it is inexpensive and does not require frequency re-adjustment once manufactured.

DESCRIPTION OF THE DRAWINGS

An embodiment of the present invention will now be described with reference to the following description and figures, wherein:

FIG. 4 is an example of a software algorithm to allow automatic retuning of the VCO.

DESCRIPTION OF THE PREFERRED EMBODIMENTS

Figure 1A:
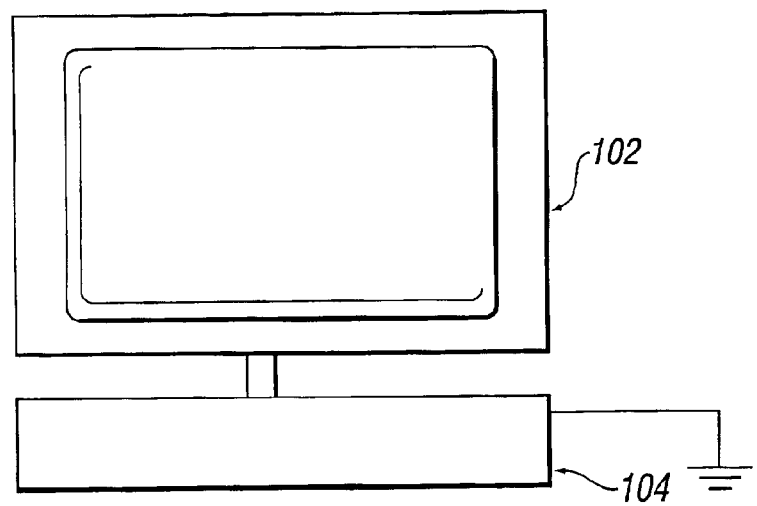
FIG. 1a is an example of a television system according to an embodiment of the present invention.

A television system is provided including a display screen 102 connected to a broadcast data receiver (BDR) 104 (also known as a set top box), as shown in FIG. 1a.

Figure 1B:
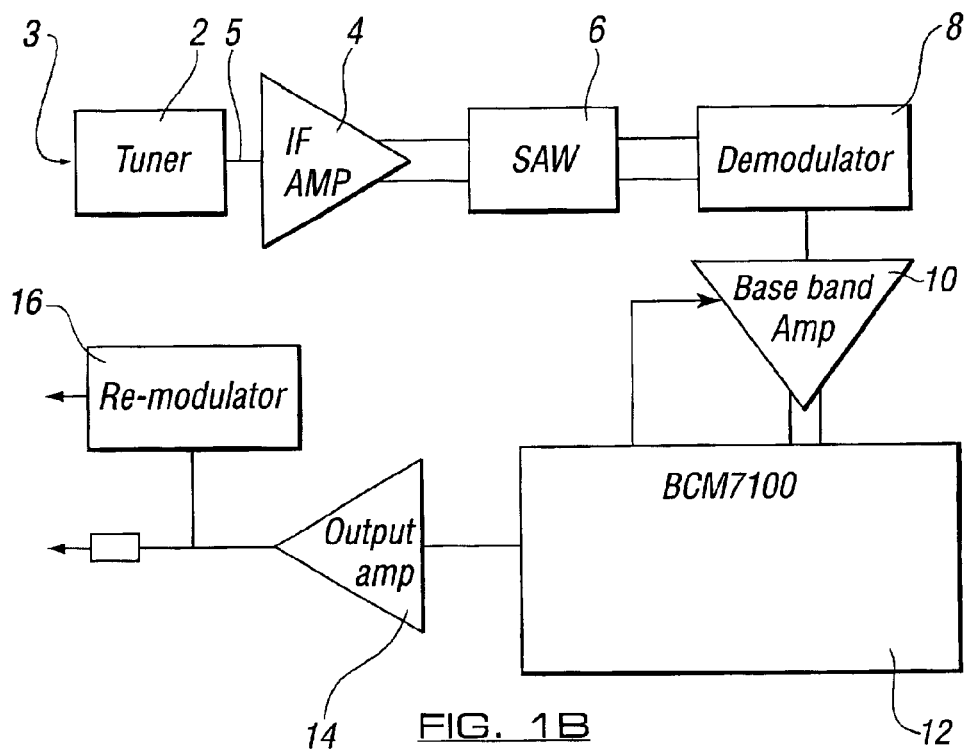
FIG. 1b is a schematic diagram showing the components contributing to video signal flatness within a BDR.

FIG. 1b illustrates the components through which an analogue video signal passes when received by the BDR 104. These components include a tuner 2, an IF amplifier 4, a SAW filter 6, a VCO demodulator 8, a base band amplifier 10, a processor 12 which decodes the baseband signal in the digital domain, genlocks and adds graphics thereto, an output amplifier 14 and a remodulator 16.

Figures 2, 3:
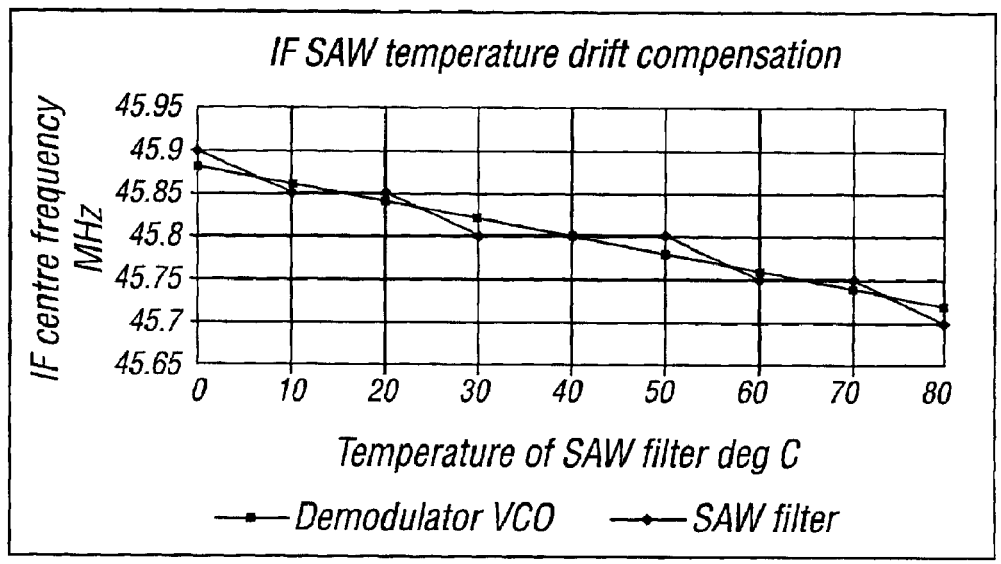
FIG. 2 is a graph showing IF Centre Frequency change with temperature for the demodulator VCO and SAW filter.
FIG. 3 is an example of a look up table which may be used with the present invention.

The tuner 2 selects the required channel from data input at 3 and outputs an intermediate frequency (I.F) 5 at a nominal frequency of 45.75 MHz. The SAW filter 6 allows rejection of unwanted channel signals which are typically adjacent to the selected and wanted channel. The VCO analogue demodulator 8 follows the frequency of the SAW filter 6 and has to compensate for frequency drift of the SAW filter caused by changes in temperature. For example, the ideal picture carrier intermediate frequency for the SAW filter is 45.75 MHz at 45° C., but at 25 ° C., the IF for the SAW filter is 45.81 MHz. FIG. 2 illustrates how the IF center frequency drifts with changes in SAW filter temperature for the VCO demodulator and the SAW filter.

In accordance with the present invention temperature sensing means are provided in the BDR in the locality of the SAW filter to allow the detection of changes in temperature in the BDR, and particularly temperature changes likely to be encountered by the SAW filter. A temperature reading is taken at pre-determined time intervals, for example every 30 minutes. The reading is then stored in memory means provided in the BDR. An average temperature reading is calculated from these stored readings using the processor of the BDR. This average reading is then compared against pre-defined VCO frequencies at different temperatures. An example of pre-defined VCO frequencies at different temperatures is illustrated in the look up table in FIG. 3. The data in this table is typically stored in the memory of the BDR and can be accessed by the processor as and when required. Alternatively, the pre-defined VCO frequencies are obtained using a software algorithm provided in the processing means, and an example of such an algorithm is provided in FIG. 4. This algorithm uses the maximum and minimum recorded temperatures to obtain a suitable VCO frequency.

The pre-defined VCO frequency corresponding to the average temperature reading is then used to retune the VCO of the BDR thereto, thereby allowing the VCO to match the frequency of the SAW Filter without requiring re-tuning during production.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. A method by which temperature drift in surface acoustic wave filters can be compensated for in a television system, said television system including a broadcast data receiver for receiving digital data from a broadcaster at a remote location and having processing means for processing and decoding said data to provide audio, video and/or auxiliary data relating to a number of channels and/or programs and including at least one surface acoustic wave filter and a voltage controlled oscillator, said method includes the steps of:

taking one or more temperature reading(s) for the surface acoustic wave filter;

comparing said temperature reading(s) with predefined voltage control oscillator frequency values at predefined temperatures and adjusting, if required, the frequency of the voltage control oscillator to an appropriate predefined frequency value for the temperature reading(s).

2. A method according to claim 1 wherein said voltage control oscillator frequency is re-tuned to match the appropriate frequency for the measured temperature to compensate for frequency drift of the surface acoustic wave filter with temperature.

3. A method according to claim 1 wherein the voltage control oscillator is a pulse locked loop exact frequency demodulator.

4. A method according to claim 1 wherein the temperature readings are provided by temperature sensing means provided in the broadcast data receiver.

5. A method according to claim 4 wherein the temperature sensing means are provided in the broadcast data receiver in the locality of the surface acoustic wave filter.

6. A-method according to claim 4 wherein the temperature sensing means includes one or more temperature sensors incorporated in a demodulator integrated circuit.

7. A method according to claim 1 wherein the surface acoustic waver filter is an intermediate frequency surface acoustic wave filter.

8. A method according to claim 1 wherein the predefined voltage control oscillator frequency values at pre-defined temperatures are provided in memory connected to for forming part of the broadcast date receiver.

9. A method according to claim 1 wherein the temperature used to define a frequency value for the voltage control oscillator comprises an average of temperature readings taken over a predetermined period of time.

10. A method according to claim 1 wherein the temperature used to define a frequency value for the voltage control oscillator is the most recently taken temperature reading.

11. A television system, said television system comprising:

a broadcast data receiver for receiving digital data from a broadcaster at a remote location including, processing means for processing and decoding said data to provide audio, video and/or auxiliary data relating to a number of channels and/or programs, at least one surface acoustic wave filter and a voltage controlled oscillator, temperature sensing means to allow one or more temperature readings to be measured and said measured temperature readings are compared against pre-defined voltage control oscillator frequency values for different temperatures, thereby allowing the frequency of the voltage control oscillator to be adjusted to one of the selected predefined frequency values which is appropriate for the measured temperature.

\* \* \* \* \*